United States Patent
Yen et al.

(10) Patent No.: US 11,616,012 B2
(45) Date of Patent: Mar. 28, 2023

(54) PATTERNED SHIELDING STRUCTURE

(71) Applicant: Realtek Semiconductor Corporation, Hsinchu (TW)

(72) Inventors: Hsiao-Tsung Yen, Hsinchu (TW); Kuan-Yu Shih, Hsinchu (TW); Chih-Yu Tsai, Hsinchu (TW); Ka-Un Chan, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 395 days.

(21) Appl. No.: 16/830,555

(22) Filed: Mar. 26, 2020

(65) Prior Publication Data
US 2021/0090988 A1    Mar. 25, 2021

(30) Foreign Application Priority Data
Sep. 24, 2019   (TW) .................. 108134470

(51) Int. Cl.
*H01L 23/522* (2006.01)
*H01L 49/02* (2006.01)

(52) U.S. Cl.
CPC .......... *H01L 23/5225* (2013.01); *H01L 28/10* (2013.01)

(58) Field of Classification Search
CPC .................................................. H01L 23/5225
See application file for complete search history.

(56) References Cited

U.S. PATENT DOCUMENTS

| | | | |
|---|---|---|---|
| 9,780,162 B2 | 10/2017 | Yen et al. | |
| 10,134,684 B2 | 11/2018 | Yen et al. | |
| 2004/0183156 A1* | 9/2004 | Lowther | H01L 27/08 257/E21.022 |
| 2017/0076857 A1* | 3/2017 | Huang | H01F 27/363 |

FOREIGN PATENT DOCUMENTS

| | | |
|---|---|---|
| TW | 201618269 A | 5/2016 |
| TW | I575696 B | 3/2017 |
| TW | I615860 B | 2/2018 |
| WO | 2018004510 A1 | 1/2018 |
| WO | 2018118084 A1 | 6/2018 |

* cited by examiner

*Primary Examiner* — William A Harriston
(74) *Attorney, Agent, or Firm* — Locke Lord LLP; Tim Tingkang Xia, Esq.

(57) ABSTRACT

A patterned shielding structure is disposed between an inductor structure and a substrate. The patterned shielding structure includes a shielding layer and a first stacked structure. The shielding layer extends along a plane. The first stacked structure is stacked, along a first direction, on the shielding layer. The first direction is perpendicular to the plane. The first stacked structure has a crossed shape and is configured to enhance a shielding effect.

19 Claims, 9 Drawing Sheets

PATTERNED SHIELDING STRUCTURE

RELATED APPLICATIONS

This application claims priority to Taiwanese Application Serial Number 108134470 filed Sep. 24, 2019, which is herein incorporated by reference.

BACKGROUND

Technical Field

The present disclosure relates to a semiconductor technology. More particularly, the present disclosure relates to a patterned shielding structure applied to an integrated inductor.

Description of Related Art

With development of the integrated circuit (IC) technology, electrical elements in an integrated circuit become smaller and smaller. However, when electrical elements in an integrated circuit become smaller and smaller, many negative impacts will occur. For example, a quality factor value (Q value) of an inductor is affected due to eddy currents generated by a substrate when the inductor operates.

SUMMARY

One embodiment of the present disclosure is related to a patterned shielding structure. The patterned shielding structure is disposed between an inductor structure and a substrate. The patterned shielding structure includes a shielding layer and a first stacked structure. The shielding layer extends along a plane. The first stacked structure is stacked, along a first direction, on the shielding layer. The first direction is perpendicular to the plane. The first stacked structure has a crossed shape and is configured to enhance a shielding effect.

One embodiment of the present disclosure is related to a patterned shielding structure. The patterned shielding structure is disposed between an inductor structure and a substrate. The patterned shielding structure includes a shielding layer and a stacked structure. The shielding layer includes a main branch and a plurality of secondary branches. The stacked structure is disposed on the main branch. The stacked structure is configured to enhance a shielding effect.

As the above embodiments, the shielding effect of the patterned shielding structure can be enhanced by disposing the stacked structure on the shielding layer.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
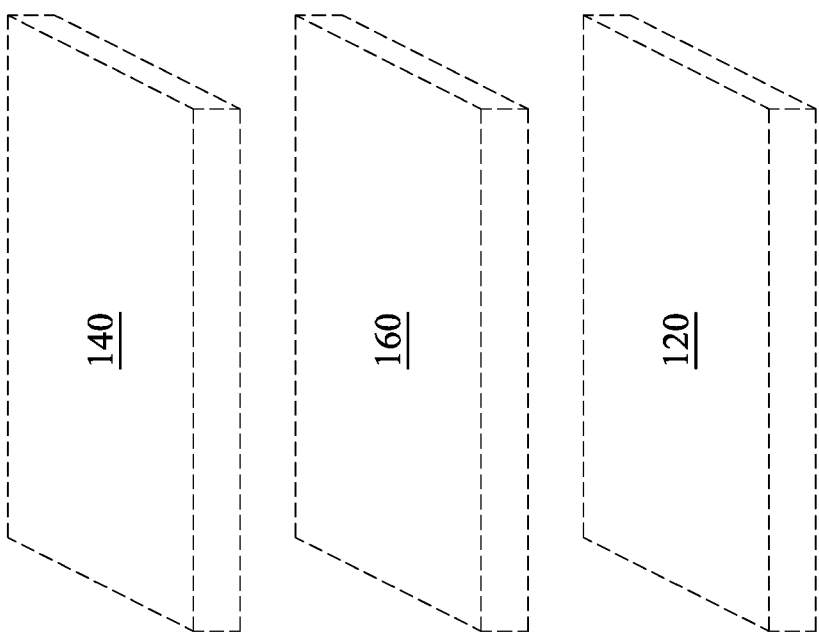
FIG. 1 is a schematic diagram illustrating a substrate, an inductor structure, and a patterned shielding structure according to some embodiments of the present disclosure.
Figure 1:
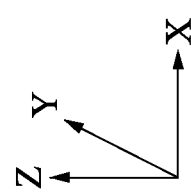

Reference is now made in detail to the present embodiments of the disclosure, examples of which are illustrated in the accompanying drawings. Wherever possible, the same reference numbers are used in the drawings and the description to refer to the same or like parts. The embodiments below are described in detail with the accompanying drawings, but the examples provided are not intended to limit the scope of the disclosure covered by the description. The structure and operation are not intended to limit the execution order. Any structure regrouped by elements, which has an equal effect, is covered by the scope of the present disclosure.

Reference is made to FIG. 1. FIG. 1 is a schematic diagram illustrating a substrate 120, an inductor structure 140, and a patterned shielding structure 160 according to some embodiments of the present disclosure. As illustrate in FIG. 1, the substrate 120, the inductor structure 140, and the patterned shielding structure 160 are disposed in a plane formed by a direction X and a direction Y. The direction X is perpendicular to the direction Y.

Figure 2:
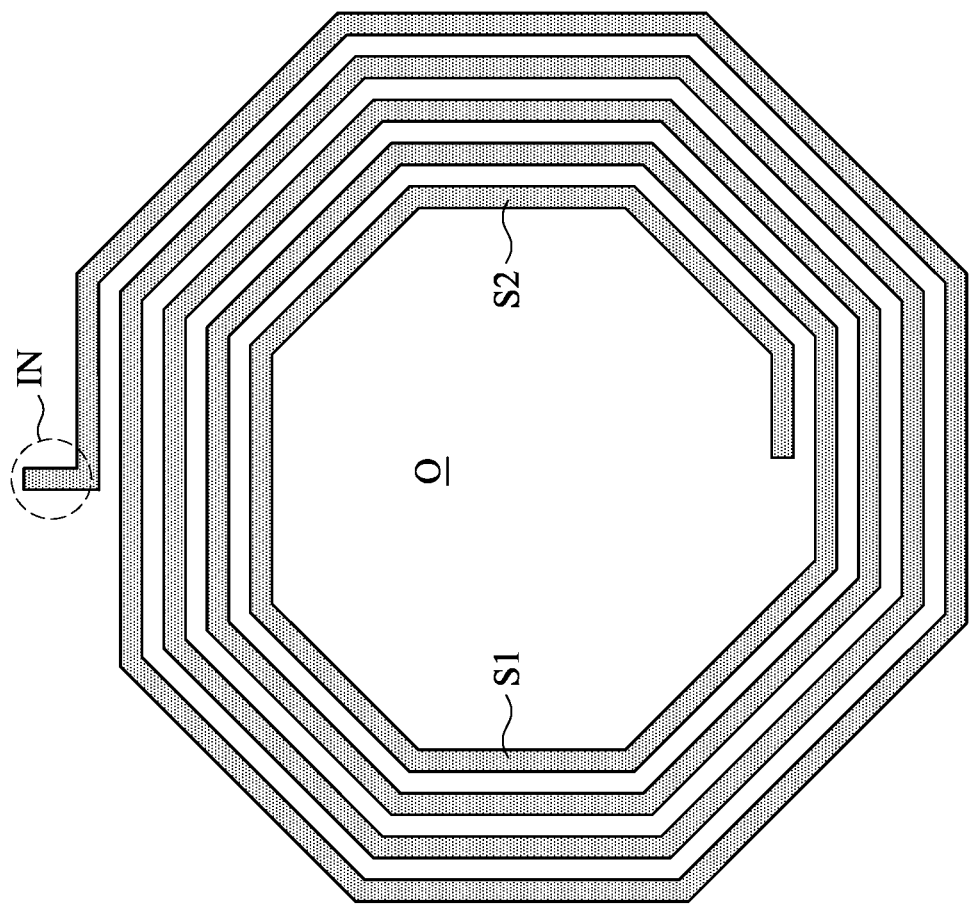
FIG. 2 is a schematic diagram illustrating an inductor structure according to some embodiments of the present disclosure.

References are made to FIG. 1 and FIG. 2. FIG. 2 is a schematic diagram illustrating an inductor structure 140A according to some embodiments of the present disclosure. In some embodiments, the inductor structure 140A in FIG. 2 is configured to implement the inductor structure 140 in FIG. 1, but the present disclosure is not limited thereto. As illustrated in FIG. 2, the inductor structure 140A has a spiral shape. An opening O is formed in the inductor structure 140. A metal segment S1 and a metal segment S2 are at two sides of the opening O respectively. In some related approaches, if there is no patterned shielding structure between the substrate 120 and the inductor structure 140, an eddy current is generated on the substrate 120 due to a magnetic field generated when the inductor structure 140 operates. The eddy current affects a quality factor value (Q value) of the inductor structure 140.

However, in FIG. 1, the patterned shielding structure 160 is disposed between the substrate 120 and the inductor structure 140. The patterned shielding structure 160 is grounding. The patterned shielding structure 160 can reduce a mutual inductance between the metal segment S1 and the metal segment S2 of the inductor structure 140 effectively, to prevent the substrate 120 from generating the aforementioned eddy current, such that the quality factor value (Q value) of the inductor structure 140 can be maintained effectively.

The configurations or the shape of the inductor structure 140A in the aforementioned embodiments are given for illustrative purposes only. Various configurations and various shapes configured to implement the inductor structure 140A are within the contemplated scope of the present disclosure.

Figure 3:
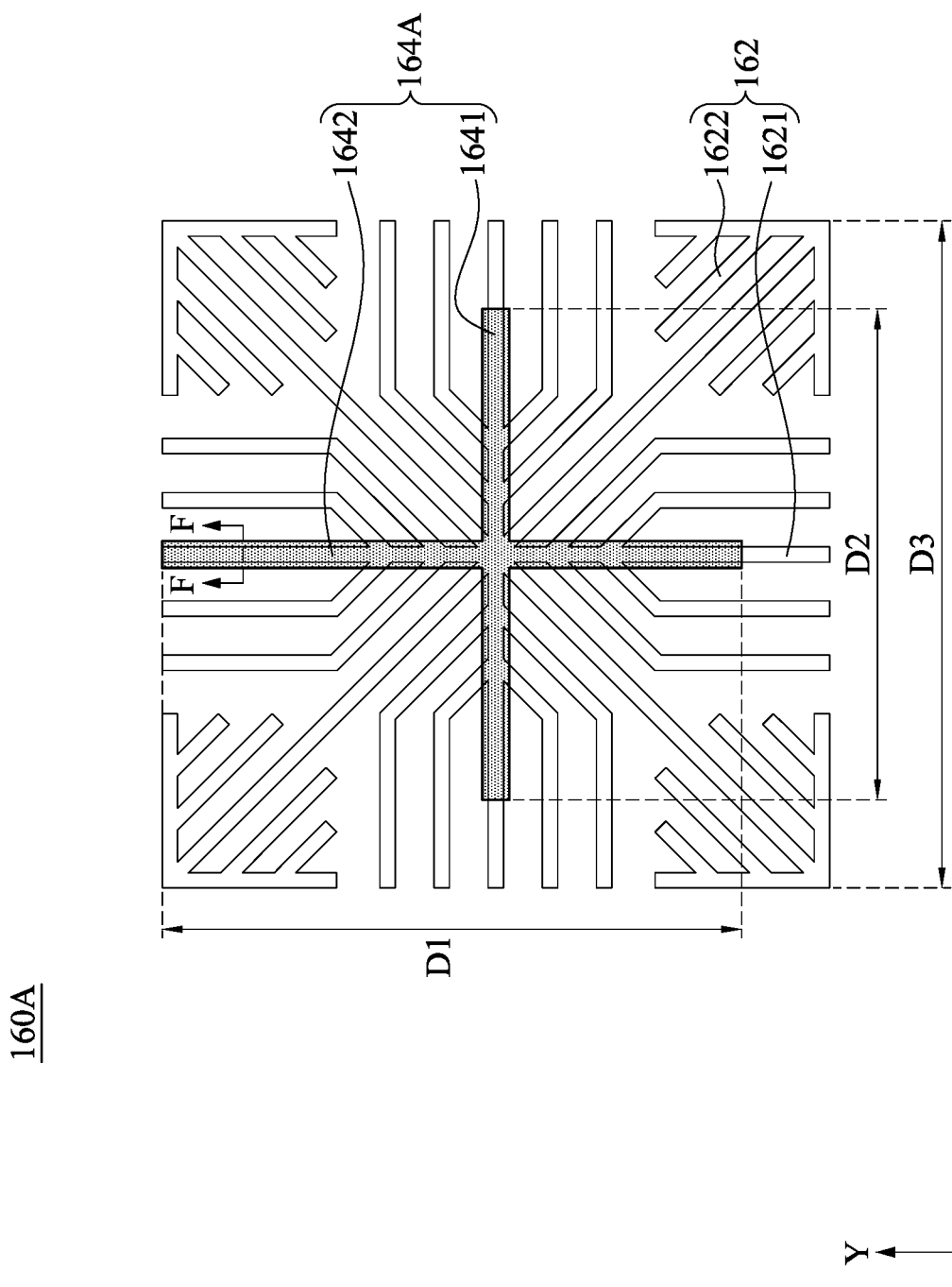
FIG. 3 is a schematic diagram illustrating a patterned shielding structure according to some embodiments of the present disclosure.

References are made to Fla 3. FIG. 3 is a schematic diagram illustrating a patterned shielding structure 160A according to some embodiments of the present disclosure. In some embodiments, the patterned shielding structure 160A in FIG. 3 is configured to implement the patterned shielding structure 160 in FIG. 1, but the present disclosure is not limited thereto. As illustrated in FIG. 3, the patterned shielding structure 160A includes a shielding layer 162 and a stacked structure 164A. The shielding layer 162 extends along the plane formed by the direction X and the direction Y. The shielding layer 162 includes a main branch 1621 and a plurality of secondary branches 1622. The secondary branches 1622 are connected to the main branch 1621. As illustrated in FIG. 3, the shielding layer 162 has a radial shape and the stacked structure 164A has a crossed shape. The stacked structure 164A is stacked, toward a direction Z, on the main branch 1621 of the shielding layer 162. The direction Z is perpendicular to the plane formed by the direction X and the direction Y. In some other embodiments, the stacked structure 164A may be stacked under the shielding layer 162. In addition, as illustrated in FIG. 3, a width of the stacked structure 164A is slightly greater than a width of the main branch 1621.

The configurations or the shape of the shielding layer 162 in the aforementioned embodiments are given for illustrative purposes only. Various configurations and various shapes configured to implement the shielding layer 162 are within the contemplated scope of the present disclosure.

With disposing the stacked structure 164A corresponding to a position of the opening O, the stacked structure 164A can reduce a mutual inductance between the metal segment S1 and the metal segment S2 of the inductor structure 140 effectively, to prevent the aforementioned eddy current. Thus, a shielding effect of the patterned shielding structure 160A can be enhanced, such that the quality factor value (Q value) of the inductor structure 140 can be maintained effectively.

Figure 4:
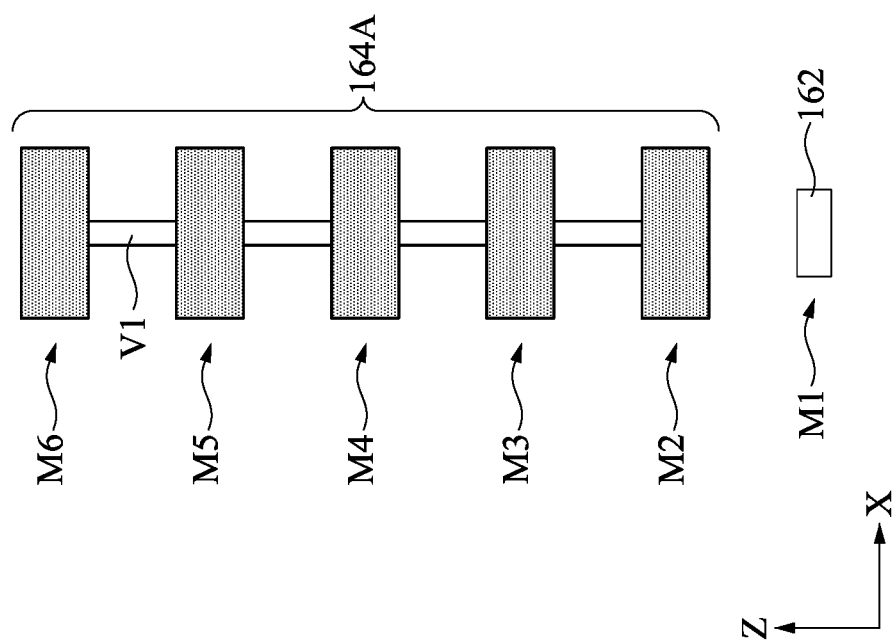
FIG. 4 is a cross section diagram illustrating a cross section line in FIG. 3 according to some embodiments of the present disclosure.

Reference is made to FIG. 4. FIG. 4 is a cross section diagram illustrating a cross section line FF in FIG. 3 according to some embodiments of the present disclosure. As illustrated in FIG. 4, the shielding layer 162 is disposed at a metal layer M1. In some embodiments, the stacked structure 164A has at least two metal layers stacked together with more than one connection via or multiple connection for connecting the at least two metal layers. As illustrated in FIG. 4, the stacked structure 164A includes a plurality of metal structures. The metal structures are disposed at metal layers M2, M3, M4, M5, and M6 respectively. These metal structures have a same shape. In some embodiments, the stacked structure 164A merely includes two metal structures. In some other embodiments, the stacked structure 164A preferably includes six or more than six metal structures.

At least one connection via V1 is disposed between any adjacent two of the metal structures. The connection via V1 connects the any adjacent two of the metal structures. For example, the connection via V1 connects the metal layer M6 and the metal layer M5, the connection via V1 connects the metal layer M5 and the metal layer M4, and so on. The inductor structure 140 is disposed at the metal layer M6. For example, the inductor structure 140 may be disposed at a metal layer (M7) (not shown) and a metal layer (M8) (not shown).

Reference is made to FIG. 3 again. Each of the metal structures of the stacked structure 164A includes a first portion 1641 and a second portion 1642. The first portion 1641 extends toward the direction X. The second portion 1642 extends toward the direction Y. In other words, the first portion 1641 and the second portion 1642 are interlaced. In addition, a length D2 of the first portion 1641 and a length D1 of the second portion 1642 are shorter than a side length D3 of the shielding layer 162.

References are made to FIG. 2 and FIG. 3. As illustrated in FIG. 2, the inductor structure 140A includes an input terminal IN. A perpendicular projection shadow, on the plane formed by the direction X and the direction Y, of the stacked structure 164A in FIG. 3 is overlapped to at least part of a perpendicular projection shadow, on the plane, of the input terminal IN. For example, the second portion 1642 of the stacked structure 164A in FIG. 3 extends above the input terminal IN of the inductor structure 140A in FIG. 2. Thus, a shielding effect can be achieved.

Figure 5:
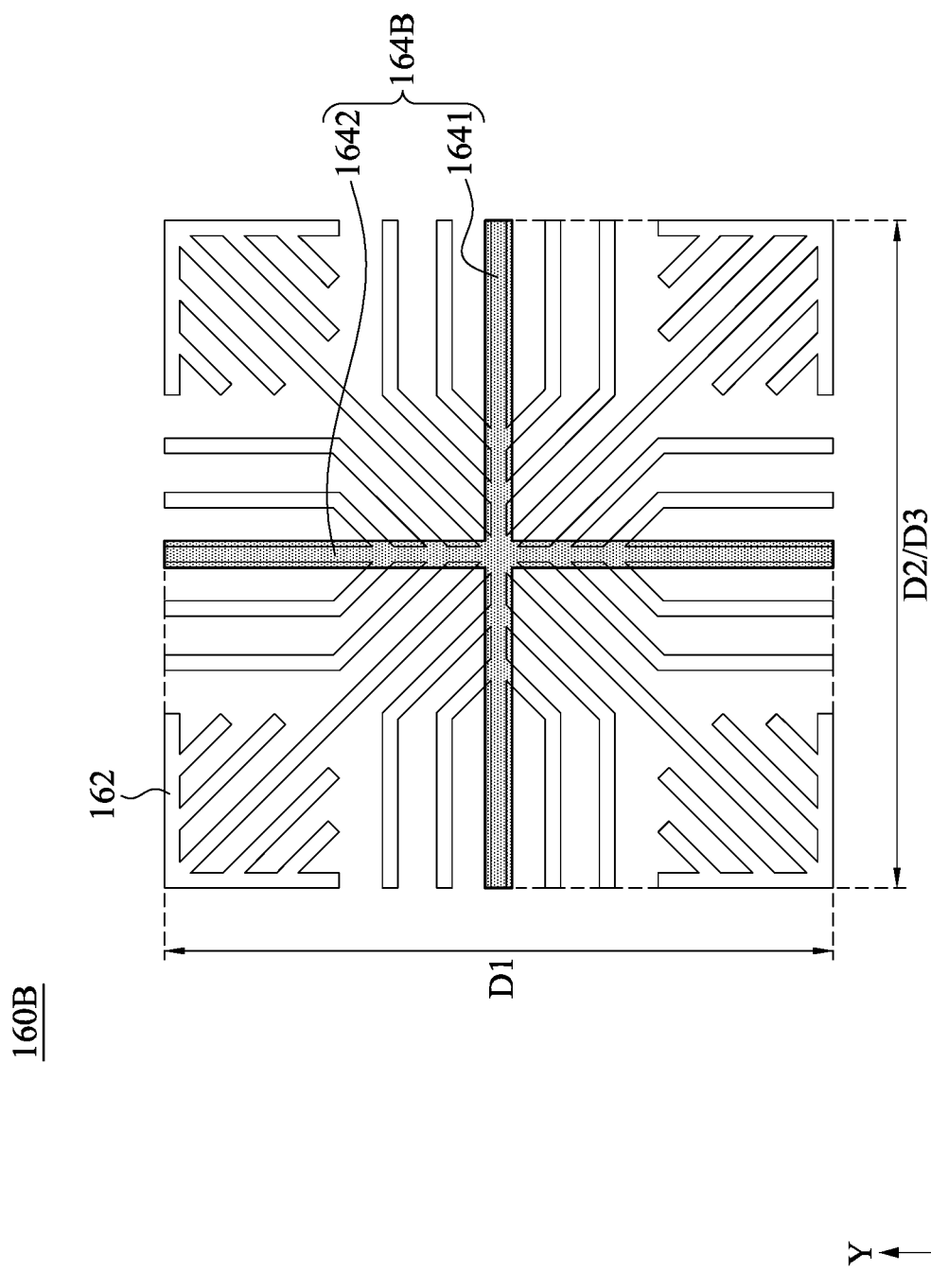
FIG. 5 is a schematic diagram illustrating a patterned shielding structure according to some embodiments of the present disclosure.

Reference is made to FIG. 5. FIG. 5 is a schematic diagram illustrating a patterned shielding structure 160B according to some embodiments of the present disclosure. The difference between the patterned shielding structure 160B in FIG. 5 and the patterned shielding structure 160A in FIG. 3 at least is that, in the patterned shielding structure 160B in FIG. 5, the length D2 of the first portion 1641 of the stacked structure 164B and the length D1 of the second portion 1642 of the stacked structure 164B are equal to the side length D3 of the shielding layer 162.

Figure 6:
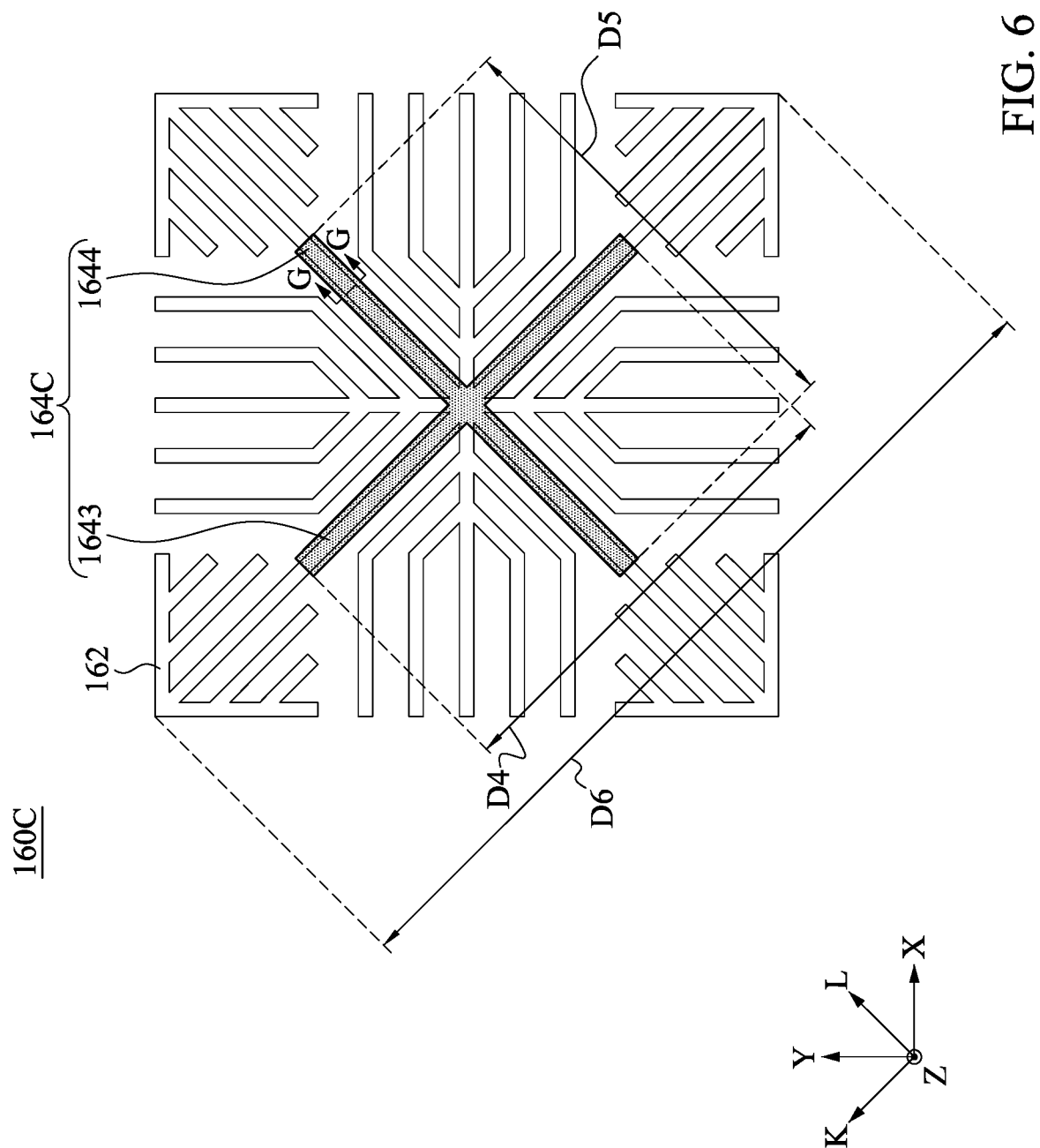
FIG. 6 is a schematic diagram illustrating a patterned shielding structure according to some embodiments of the present disclosure.

Reference is made to FIG. 6. FIG. 6 is a schematic diagram illustrating a patterned shielding structure 160C according to some embodiments of the present disclosure. The difference between the patterned shielding structure 160C in FIG. 6 and the patterned shielding structure 160A in FIG. 3 at least is that a stacked structure 164C of the patterned shielding structure 160O in FIG. 6 includes a plurality of metal structures, and each of the metal structures includes a third portion 1643 and a fourth portion 1644. The third portion 1643 and the fourth portion 1644 are interlaced. The third portion 1643 extends toward a direction K perpendicular to the direction Z. The fourth portion 1644 extends toward a direction L perpendicular to the direction Z. The direction K is perpendicular to the direction L. As illustrated in FIG. 5, the direction K, the direction L, the direction X, and the direction Y are different from each other. In addition, a length D4 of the third portion 1643 and a length D5 of the fourth portion 1644 are shorter than a length of a diagonal line D6 of the shielding layer 162.

Figure 7:
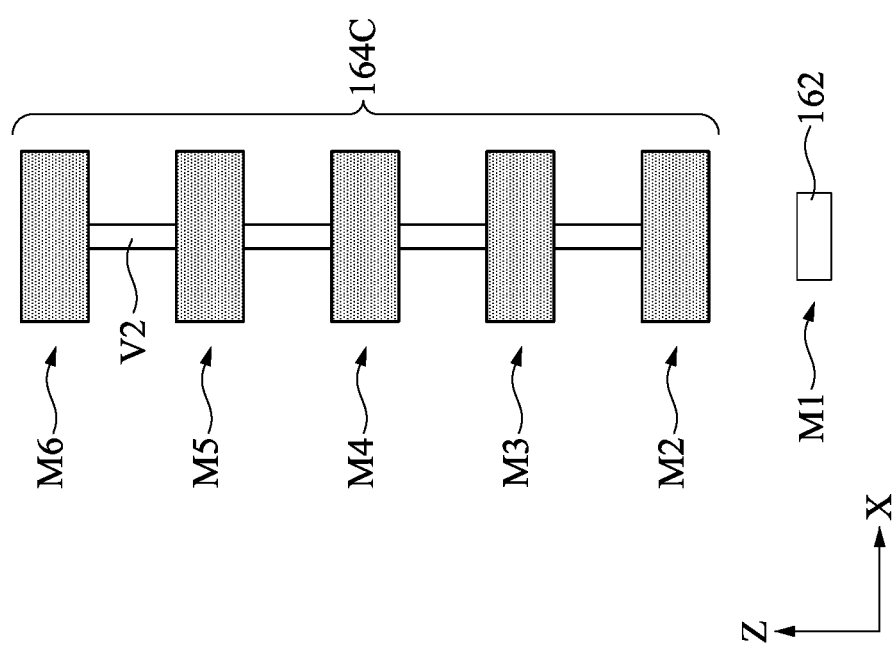
FIG. 7 is a cross section diagram illustrating a cross section line in FIG. 6 according to some embodiments of the present disclosure.

Reference is e made to FIG. 7. FIG. 7 is a cross section diagram illustrating a cross section line in FIG. 6 according to some embodiments of the present disclosure. As illustrated in FIG. 7, the shielding layer 162 is disposed at the metal layer M1. In some embodiments, the stacked structure 164C has at least two metal layers stacked together with more than one connection via or multiple connection for connecting the at least two metal layers. As illustrated in FIG. 7, the stacked structure 164C includes a plurality of metal structures. The metal structures are disposed at the metal layer M2, M3, M4, M5, and M6 respectively. The metal structures have a same shape. At least one connection via V2 is disposed between any adjacent two of the metal structures. The connection via V2 connects the any adjacent two of the metal structures. For example, the connection via V2 connects the metal layer M6 and the metal layer M5, the connection via V2 connects the metal layer M5 and the metal layer M4, and so on. The inductor structure 140 is disposed at the metal layer M6. For example, the inductor structure 140 is disposed at the metal layer (M7) (not shown) and the metal layer (M8) (not shown).

Figure 8:
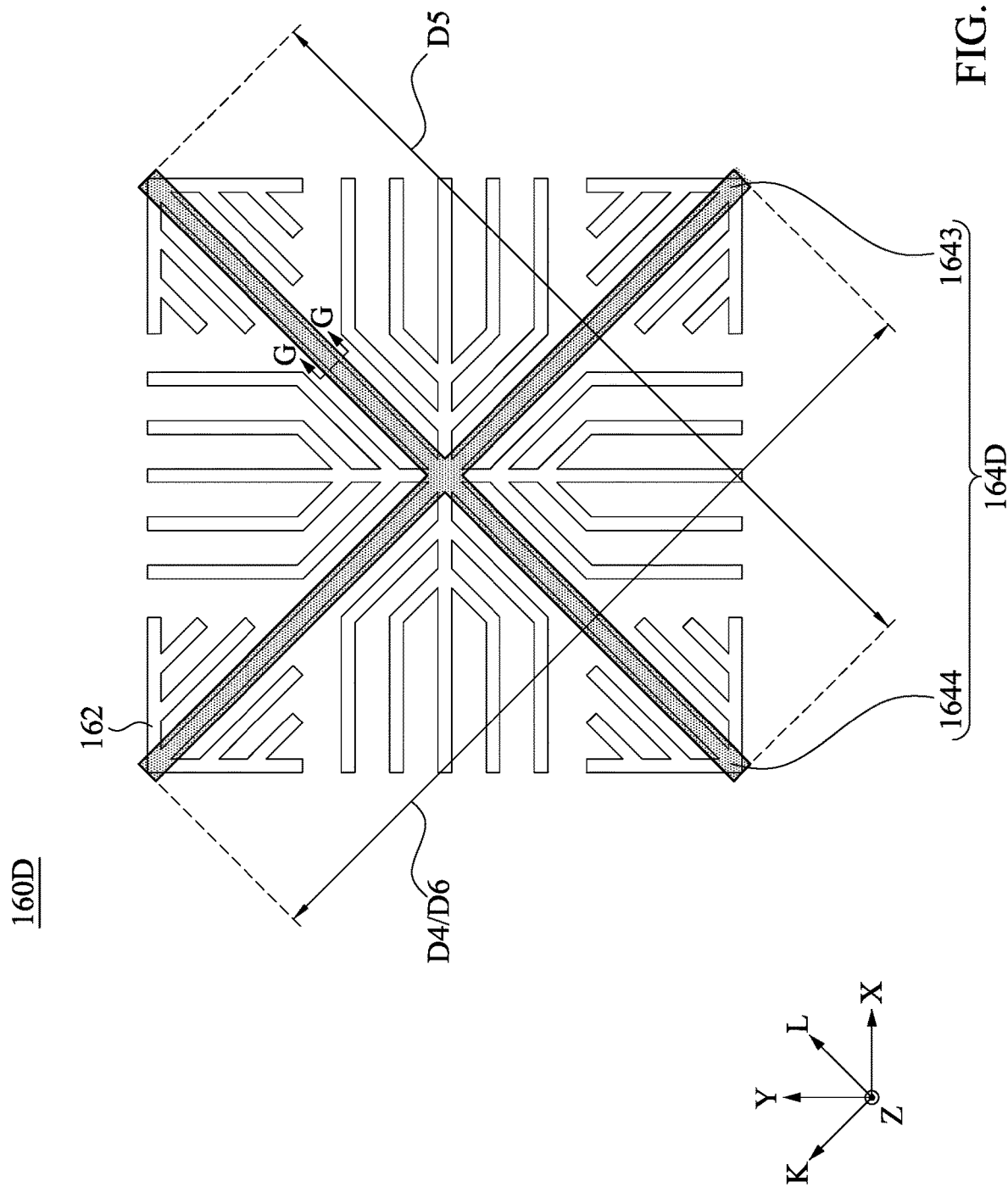
FIG. 8 is a schematic diagram illustrating a patterned shielding structure according to some embodiments of the present disclosure.

Reference is made to FIG. 8. FIG. 8 is a schematic diagram illustrating a patterned shielding structure 160D according to some embodiments of the present disclosure. The difference between the patterned shielding structure 160D in FIG. 8 and the patterned shielding structure 160C in FIG. 6 at least is that, in the patterned shielding structure 160D in FIG. 8, the length D4 of the third portion 1643 of a stacked structure 164D and the length D5 of the fourth portion 1644 of the stacked structure 164D are equal to the length of the diagonal line D6 of the shielding layer 162.

Figure 9:
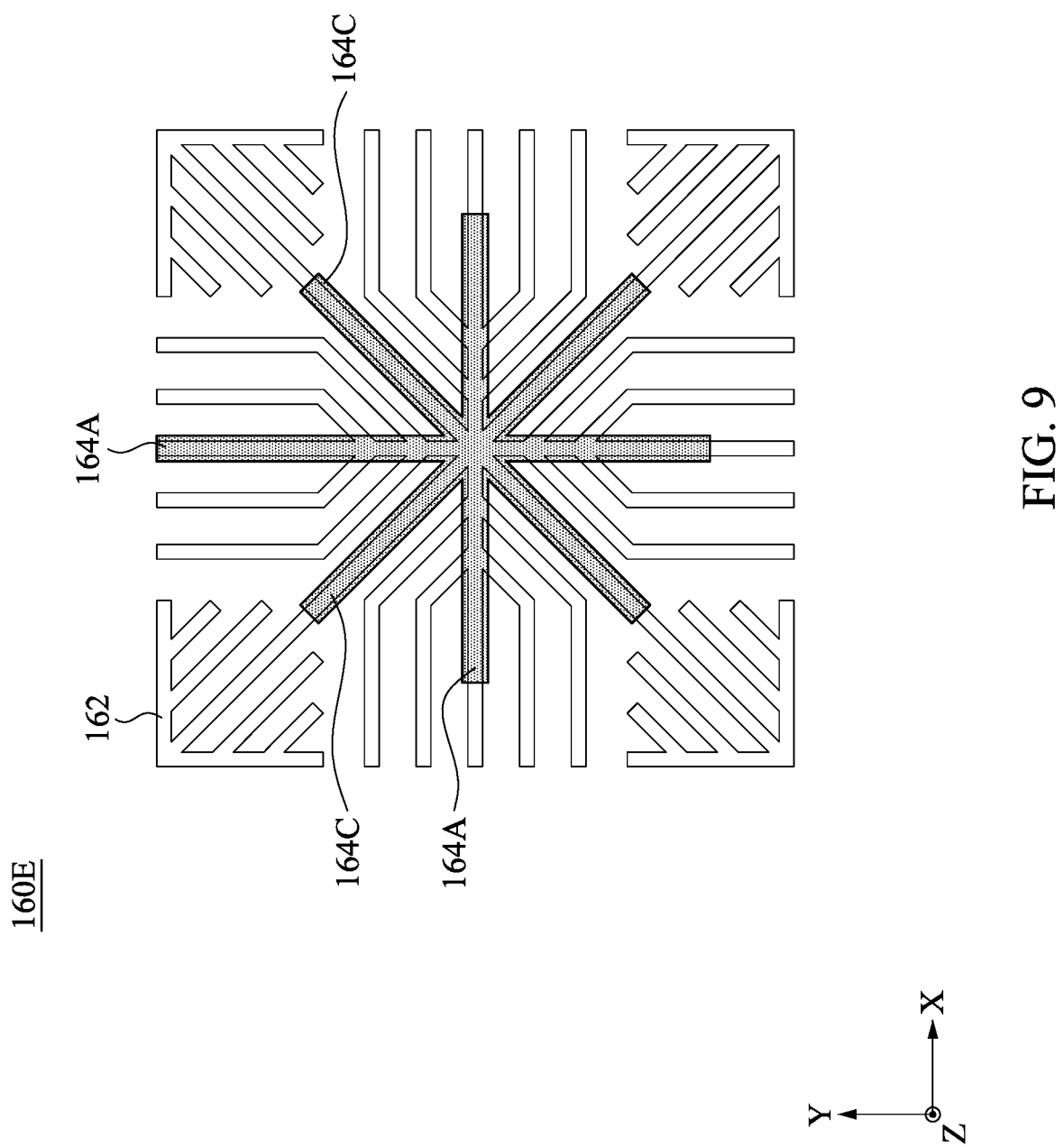
FIG. 9 is a schematic diagram illustrating a patterned shielding structure according to some embodiments of the present disclosure.

Reference is made to FIG. 9. FIG. 9 is a schematic diagram illustrating a patterned shielding structure 160E according to some embodiments of the present disclosure. The stacked structure 164A in FIG. 3 and the stacked structure 164C in FIG. 6 are disposed on the shielding layer 162 of the patterned shielding structure 160E in FIG. 9. Related contents about the stacked structure 164A and the stacked structure 164C are described in paragraphs above, so they are not described herein again.

In some embodiments, the inductor structure 140 in FIG. 2 is applied to a single-end signal. In these embodiments, the stacked structure 164A, 164B, 164C, or 164D makes a block effect of the patterned shielding structure 160A, 160B, 160C, 160D, or 160E to be better. Thus, the quality factor value (Q value) of the inductor structure 140 can be maintained, even increased.

In some other embodiments, the inductor structure 140 in FIG. 2 is applied to differential signals. In these embodiments, due to changes of impedances, transmission loss between two capacitor structures can be decreased.

As the above embodiments, the shielding effect of the patterned shielding structure can be enhanced by disposing the stacked structure on the shielding layer.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A patterned shielding structure disposed between an inductor structure and a substrate, wherein the patterned shielding structure comprises:
   a shielding layer extends along a plane; and
   a first stacked structure stacked, along a first direction, on the shielding layer, wherein the first direction is perpendicular to the plane, wherein the first stacked structure has a crossed shape and is configured to enhance a shielding effect,
   wherein the first stacked structure comprises a plurality of first metal structures and the plurality of first metal structures are disposed at different metal layers respectively.

2. The patterned shielding structure of claim 1, wherein a length of the first stacked structure is shorter than a side length of the shielding layer.

3. The patterned shielding structure of claim 1, wherein the shielding layer is disposed at a first metal layer, wherein the plurality of first metal structures are disposed at a second metal layer, a third metal layer, a fourth metal layer, a fifth metal layer, and a sixth metal layer respectively.

4. The patterned shielding structure of claim 1, wherein at least one connection via is disposed between any adjacent two of the plurality of first metal structures, and the at least one connection via connects the two of the plurality of first metal structures.

5. The patterned shielding structure of claim 1, wherein each of the plurality of first metal structures comprises a first portion and a second portion, and the first portion and the second portion are interlaced.

6. The patterned shielding structure of claim 5, wherein the first portion extends toward a second direction and the second portion extends toward a third direction, wherein the second direction is perpendicular to the third direction.

7. The patterned shielding structure of claim 6, wherein the second direction or the third direction is perpendicular to the first direction.

8. The patterned shielding structure of claim further comprising:
   a second stacked structure comprising a plurality of second metal structures, wherein the plurality of second metal structures are disposed at the different metal layers respectively,
   wherein each of the plurality of second metal structures comprises a third portion and a fourth portion, and the third portion and a fourth portion are interlaced.

9. The patterned shielding structure of claim 8, wherein a length of the second stacked structure is shorter than a length of a diagonal line of the shielding layer.

10. The patterned shielding structure of claim 8, wherein the third portion extends toward a fourth direction and the fourth portion extends toward a fifth direction, wherein the fourth direction is perpendicular to the fifth direction.

11. The patterned shielding structure of claim 10, wherein the fourth direction or the fifth direction is perpendicular to the first direction.

12. The patterned shielding structure of claim 10, wherein the second direction, the third direction, the fourth direction, and the fifth direction are different.

13. The patterned shielding structure of claim 8, wherein the shielding layer is disposed at a first metal layer, wherein the plurality of second metal structures are disposed at a second metal layer, a third metal layer, a fourth metal layer, a fifth metal layer, and a sixth metal layer respectively.

14. The patterned shielding structure of claim 13, wherein at least one connection via is disposed between any adjacent two of the plurality of second metal structures, and the at least one connection via connects the two of the plurality of second metal structures.

15. The patterned shielding structure of claim 1, wherein the inductor structure comprises an input terminal, wherein at least part of a perpendicular projection shadow of the first stacked structure on the plane is overlapped to at least part of a perpendicular projection shadow of the input terminal on the plane.

16. A patterned shielding structure disposed between an inductor structure and a substrate, wherein the patterned shielding structure comprises:
   a shielding layer comprising a main branch and a plurality of secondary branches; and a stacked structure disposed on the main branch, wherein the stacked structure is configured to enhance a shielding effect, wherein the stacked structure has a crossed shape.

17. The patterned shielding structure of claim 16, wherein the stacked structure comprises a plurality of metal structures and the plurality of metal structures are disposed at a plurality of metal layers respectively.

18. The patterned shielding structure of claim 17, wherein the shielding layer is disposed at a first metal layer, wherein the plurality of metal structures are disposed at a second metal layer, a third metal layer, a fourth metal layer, a fifth metal layer, and a sixth metal layer respectively.

19. The patterned shielding structure of claim 16, wherein the shielding layer has a radial shape.

* * * * *